United States Patent
Li et al.

(10) Patent No.: US 9,935,162 B2
(45) Date of Patent: Apr. 3, 2018

(54) ORGANIC ELECTROLUMINESCENT TRANSISTOR ARRAY SUBSTRATE AND FABRICATION METHOD THEREOF, AND DISPLAY DEVICE

(71) Applicant: BOE TECHNOLOGY GROUP CO., LTD., Beijing (CN)

(72) Inventors: Xuyuan Li, Beijing (CN); Liqiang Chen, Beijing (CN); Chunsheng Jiang, Beijing (CN); Changcheng Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/171,269

(22) Filed: Jun. 2, 2016

(65) Prior Publication Data

US 2017/0025491 A1 Jan. 26, 2017

(30) Foreign Application Priority Data

Jul. 21, 2015 (CN) .......................... 2015 1 0432425

(51) Int. Cl.
*H01L 27/32* (2006.01)
*H01L 51/56* (2006.01)
*H01L 27/12* (2006.01)

(52) U.S. Cl.
CPC ...... *H01L 27/3262* (2013.01); *H01L 27/3246* (2013.01); *H01L 27/3248* (2013.01);
(Continued)

(58) Field of Classification Search
CPC ............. H01L 27/3262; H01L 27/3246; H01L 27/3276; H01L 51/56; H01L 27/1222
See application file for complete search history.

(56) References Cited

U.S. PATENT DOCUMENTS

2005/0140281 A1* 6/2005 Park .................. H01L 51/525
313/505
2010/0259165 A1* 10/2010 Miura .................. G09G 3/20
313/505

(Continued)

FOREIGN PATENT DOCUMENTS

CN 101055887 A 10/2007
WO 2014208896 A1 12/2014

OTHER PUBLICATIONS

Chinese Office Action dated Jun. 29, 2017.
(Continued)

*Primary Examiner* — Roy Potter
(74) *Attorney, Agent, or Firm* — Dilworth & Barrese, LLP.; Michael J. Musella, Esq.

(57) ABSTRACT

An embodiment of the present disclosure provides an organic electroluminescent transistor array substrate, including a substrate, and a gate layer, a gate insulating layer, a semiconductor layer, a source layer, a pixel defining layer, an electroluminescent layer and a drain layer formed on the substrate, wherein, the source layer and the drain layer are located in different levels, the source layer includes plural source electrode units corresponding to sub-pixel units respectively, the pixel defining layer includes plural pixel defining units corresponding to the source electrode units respectively, and the respective source electrode units are embedded within the pixel defining units corresponding thereto.

14 Claims, 2 Drawing Sheets

(52) U.S. Cl.
CPC ........ *H01L 27/124* (2013.01); *H01L 27/1222* (2013.01); *H01L 27/1225* (2013.01); *H01L 27/1259* (2013.01); *H01L 2227/323* (2013.01)

(56) References Cited

U.S. PATENT DOCUMENTS

2014/0203249 A1    7/2014  Lee et al.
2017/0040396 A1*   2/2017  Li ..................... H01L 27/3258

OTHER PUBLICATIONS

K. Kudo et al, Organic static induction transistor for display devices, www.elsevier.com/locate.synmet, Synthetic Metals 11-112 (2000), pp. 11-14.
Kazuhiro Kudo, Organic light emitting transistors, www.sciencedirect.com, Current Applied Physics 5 (2005) pp. 337-340.
Raffaella Capelli et al., Organic light-emitting transistors with an efficiency that outperforms the equivalent light emitting diodes, www.nature.com/naturematerials, vol. 9, Jun. 2010, pp. 496-503.
Masakazu Nakamura, High-Performance, Verticle-Type Organic Transistors with Buit-In Nanotriode Arrays, www.researchgate.net/publication/242560272, Advanced Materials, Feb. 2007, pp. 525-530.
Chinese Office Action dated Jan. 15, 2018.

* cited by examiner

ORGANIC ELECTROLUMINESCENT TRANSISTOR ARRAY SUBSTRATE AND FABRICATION METHOD THEREOF, AND DISPLAY DEVICE

TECHNICAL FIELD

Embodiments of the present disclosure relate to an organic electroluminescent transistor array substrate and a fabrication method thereof, and a display device.

BACKGROUND

An organic electroluminescent display is a current-type light-emitting device with an organic electroluminescent material as a light emitting body. When classified according to a driving mode, the organic electroluminescent display can be divided into an organic electroluminescent display of a passive driving type and an organic electroluminescent display of an active driving type; wherein, the organic electroluminescent display of the active driving type has a low driving voltage, which is applicable to high-definition and large-size display, but with a complicated fabrication process, and a high production cost.

SUMMARY

An embodiment of the present disclosure provides an organic electroluminescent transistor array substrate, comprising a substrate, and a gate layer, a gate insulating layer, a semiconductor layer, a source layer, a pixel defining layer, an electroluminescent layer and a drain layer formed on the substrate, wherein the source layer and the drain layer are located in different levels, the source layer includes plural source electrode units corresponding to sub-pixel units respectively, the pixel defining layer includes plural pixel defining units corresponding to the source electrode units respectively, and the respective source electrode units are embedded within the pixel defining units corresponding thereto.

Another embodiment of the present disclosure provides a display device, comprising the above organic electroluminescent transistor array substrate.

A furthrt embodiment of the present disclosure provides a fabrication method of the above organic electroluminescent transistor array substrate, comprising: forming a gate layer, a gate insulating layer, a semiconductor layer, a source layer, a pixel defining layer, an organic electroluminescent layer and a drain layer on a substrate, wherein, the source layer and the drain layer are located in different levels, the source layer includes plural source electrode units corresponding to sub-pixel units respectively, the pixel defining layer includes plural pixel defining units corresponding to the source electrode units respectively, and the respective source electrode units are embedded within the pixel defining units corresponding thereto.

BRIEF DESCRIPTION OF THE DRAWINGS

The drawings illustrated here are provided for a further understanding of the present disclosure, and constitute part of the specification; the drawings together with the embodiments of the present disclosure are used to explain the present disclosure, rather than form a limitation thereto. In the drawings.

DETAILED DESCRIPTION

In order to further illustrate an organic electroluminescent transistor array substrate, a display device, and a fabrication method provided by the embodiments of the present disclosure, hereafter, detailed illustration will be provided in conjunction with the accompanying drawing.

In order to solve a problem of the complicated fabrication process and the high production cost of the organic electroluminescent display of the active driving type, an organic thin film transistor and an organic light emitting diode can be integrated into one device structure, to fabricate an organic electroluminescent transistor array substrate.

In terms of structure, the organic electroluminescent transistor array substrate is divided into a conventional organic electroluminescent transistor array substrate and an organic electroluminescent transistor array substrate of a vertical structure. In the organic electroluminescent transistor array substrate of the vertical structure, an insulating material layer which is referred to as a pixel defining layer is deposited on a surface of a source layer, and the pixel defining layer separates the source layer into plural source electrode units corresponding to sub-pixel units. Carriers generated by each source electrode unit and a drain layer can be recombined in an organic electroluminescent material, so that the organic electroluminescent material emits light. However, luminance of the organic electroluminescent material is adjusted by modulating transportation of the carriers by a gate layer; however, the carriers at an edge of the source electrode unit is usually not under control of the gate layer; and thus, it is necessary to propose an organic electroluminescent transistor array substrate, so as to solve a problem that the carriers at the edge of the source electrode unit in the organic electroluminescent transistor array substrate of the vertical structure is not under control of the gate layer.

One of the objectives of the present disclosure is to provide an organic electroluminescent transistor array substrate, a fabrication method thereof, and a display device in order to solve the problem that the carriers at the edge of the source electrode unit in the organic electroluminescent transistor array substrate is not under control of the gate layer.

Figure 1:
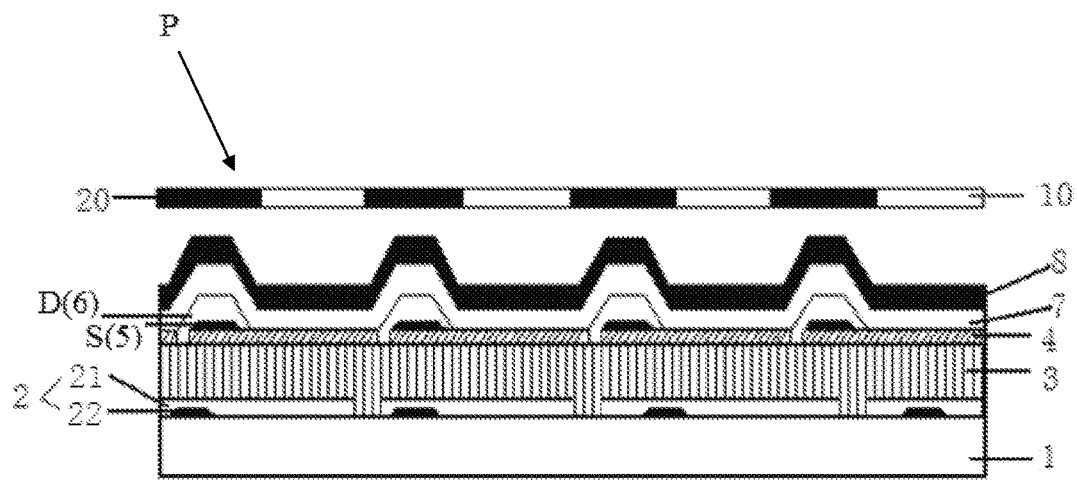
FIG. 1 is a sectional view of an organic electroluminescent transistor array substrate provided be an embodiment of the present disclosure.

With reference to FIG. 1, an organic electroluminescent transistor array substrate provided by an embodiment of the present disclosure, comprises: a substrate 1, and a gate layer 2, a gate insulating layer 3, a semiconductor layer 4, a source layer S, a pixel defining layer D, an electroluminescent layer 7 and a drain layer 8 sequentially formed along a direction of a thickness of the substrate 1, and the gate layer 2 being formed on a surface of the substrate 1.

The source layer S includes plural source electrode units 5 corresponding to sub-pixel units P. For example, FIG. 1 shows 4 sub-pixel units P. The pixel defining layer D includes plural pixel defining units 6 corresponding to the source electrode units 5. The respective source electrode units 5 are embedded within the pixel defining units 6 corresponding to the source electrode units 5; the organic electroluminescent layer 7 is formed on surfaces of the respective pixel defining units 6, and on a portion of a surface of the semiconductor layer 4 located between adjacent source electrode units 5 and exposed by the pixel defining units 6.

When the organic electroluminescent transistor array substrate provided by the embodiment of the present disclosure is in a working state, a voltage is applied between the gate layer 2 and the source layer S, and a voltage is applied between the drain layer 8 and the source layer S, so that the source layer of the organic electroluminescent transistor array substrate generates a surface electric field. Under the action of the surface electric field, the carriers from the semiconductor layer 4 is diffused and meets the carrier from the drain layer 8 in the organic electroluminescent layer 7, and they are recombined to form excitons, then energy of the exciton will transfer onto a luminescent molecule in the organic electroluminescent layer 7, so that an electron in the luminescent molecule is excited, transited from a ground state to an excited state; the electron in the excited state is unstable, and will radiate out excessive energy so as to return to the stable ground state, and the excessive energy will be radiated out in a form of light. In addition, a voltage value of the gate layer 2 can be adjusted; when the voltage value of the gate layer 2 is increased, the number of carriers in the semiconductor layer 4 is increased, and the number of excitons formed by recombination of the carrier from the semiconductor layer 4 and the carrier from the drain layer 8 in the organic electroluminescent layer 7 is increased subsequently, so that luminance radiated out is stronger; on the contrary, when the voltage value of the gate layer 2 is decreased, luminance radiated out is weaker, so as to implement adjustment of luminance of the organic electroluminescent transistor array substrate by the gate layer 2.

In the organic electroluminescent transistor array substrate provided by the embodiment of the present disclosure, the respective source electrode units 5 are embedded within the pixel defining units 6, so that the pixel defining units 6 not only defines the regions of the sub-pixel units where different source electrode units 5 are located, but also avoids mutual influence between surface electric fields generated by the adjacent source electrode units 5, thus ensuring uniformity of electric fields corresponding to the respective sub-pixel units, so that the carriers at the edge of the source electrode unit 5 can be well controlled by the gate layer 2. Furthermore, the pixel defining unit 6 completely separates the source electrode unit 5 from the organic electroluminescent layer 7, which allows the carriers to be better diffused into the organic electroluminescent layer 7.

It should be noted that, the respective source electrode units 5 formed on the semiconductor layer 4 respectively correspond to the sub-pixel units, and thus, there is an exposed portion of the semiconductor layer 4 between the adjacent source electrode units 5 on the semiconductor layer 4. Here, the exposed portion of the semiconductor layer 4 refers to a portion of the semiconductor layer 5 which is not covered by the pixel defining units 6.

Moreover, in order to further avoid mutual influence between the surface electric fields generated by the adjacent source electrode units 5, the semiconductor layer 4 according to the above-described embodiment is provided with plural via holes, the respective source electrode units 5 are provided on the semiconductor layer 4 and are located between the adjacent via holes, and the respective via holes and the respective pixel defining units 6 are connected in one-to-one correspondence. For example, the pixel defining units 6 extends completely or partially into the via holes, so that the respective via holes and the respective pixel defining units 6 are connected in one-to-one correspondence. Thus, each of the source electrode units 5 is completely embedded within the corresponding pixel defining unit 6. By using the organic electroluminescent transistor array substrate of the above-described structure, it is ensured that no phenomenon of interference will occur between the surface electric fields formed correspondingly by the adjacent source electrode units 5.

Figure 2:
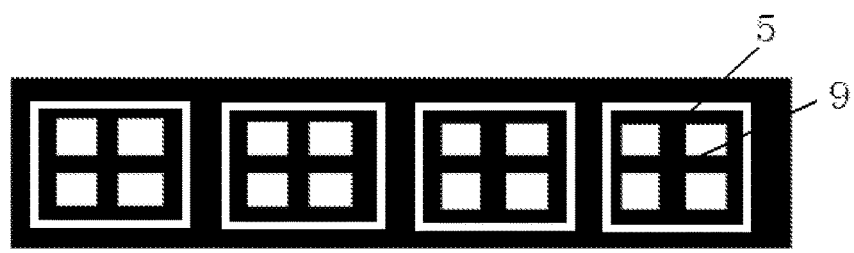
FIG. 2 is a top view of a grid-like source layer provided be an embodiment of the present disclosure.

With reference to FIG. 2, in the organic electroluminescent transistor array substrate provided by the above-described embodiment, the source electrode units 5 corresponding to the respective sub-pixel units may be of any pattern. In order that the organic electroluminescent transistor array substrate achieves a better light emitting effect, the above-described source electrode unit 5 is, for example, of a grid-shape pattern 9; as compared with a common plane pattern, the source electrode unit 5 having the grid-shape pattern 9 has a larger actual surface area; when the same voltage is applied between the gate layer 2 and the source layer S, the surface electric field correspondingly generated by the source electrode unit 5 having the grid-shape pattern 9 has an increased area, and thus, when the source electrode unit 5 is fabricated into the grid-shape pattern 9, the number of the carriers diffused to the semiconductor layer 4 can be increased, and the number of excitons formed in the organic electroluminescent layer 7 by recombination of the carrier from the semiconductor layer 4 with the carrier from the drain layer 8 is also increased correspondingly, so that more energy can be generated, and so that light emitted out of the organic electroluminescent layer 7 is more uniform, to implement a better light emitting effect.

Further, in order to enhance transportation capability of the carriers, the semiconductor layer 4 in the organic electroluminescent transistor array substrate provided by the above-described embodiment is made of one or more materials of, for example, amorphous silicon, microcrystalline silicon, polycrystalline silicon, indium gallium zinc oxide (IGZO), indium tin zinc oxide (ITZO) and nitrogen zinc oxide (ZnON). Since these materials are oxide semiconductor materials with a better uniformity, and these materials themselves include more carriers, they can provide adequate carriers for the organic electroluminescent transistor array substrate, so as to improve luminous efficiency of the organic electroluminescent transistor array substrate, and ensure luminous uniformity of the sub-pixel units.

The gate layer 2 of the organic electroluminescent transistor array substrate provided by the above-described embodiment, for example, includes: gate lines 22 and transparent conductive thin film layer 21, the gate lines 22 being formed on the surface of the substrate 1, and the transparent conductive thin film layer 21 being formed on a surface of the exposed portion of the substrate 1 located between the adjacent gate lines 22 and surfaces of the gate lines 22. Therein, the gate line 22 plays a role in signal transmission in the organic electroluminescent transistor array substrate; and the transparent conductive thin film layer 21 plays a role in conducting in the organic electroluminescent transistor array substrate.

When used, by adjusting the voltage applied between the source layer S and the gate layer 2, the gate layer 2 can implement control of carrier transport, so as to implement adjustment of luminance of the organic electroluminescent transistor array substrate.

It should be noted that, the gate lines 22 are formed on the surface of the substrate 1, the gate line 22 corresponds to the respective source electrode units 5, and thus, there is an exposed portion of the substrate 1 between the adjacent gate lines 22 on the substrate 1. Here, the exposed portion of the substrate 1 refers to a portion of the substrate 1 which is not covered by the gate line 22.

An embodiment of the present disclosure further provides a display device, comprising the organic electroluminescent transistor array substrate provided by the above-described embodiments.

The display device fabricated by using the organic electroluminescent transistor array substrate provided by the above-described technical solution, ensures uniform electric field corresponding to the respective sub-pixel units, and can eliminate a phenomenon that the carriers at the edge of the respective source electrode units 5 is not under control of the gate layer 2, so that the display device achieves an better display effect.

With reference to FIG. 1, an embodiment of the present disclosure further provides a fabrication method of the above-described organic electroluminescent transistor array substrate, comprising: sequentially forming a gate layer 2, a gate insulating layer 3, a semiconductor layer 4, a source layer S, a pixel defining layer D, an organic electroluminescent layer 7 and a drain layer 8 along a direction of a thickness of a substrate 1, the gate layer 2 being formed on a surface of the substrate 1; wherein, the source layer includes plural source electrode units 5 corresponding to sub-pixel units respectively, the pixel defining layer D includes plural pixel defining units 6 corresponding to the source electrode units 5 respectively; the respective source electrode units 5 are embedded within the corresponding pixel defining units 6; and an organic electroluminescent layer 7 is formed on surfaces of the respective pixel defining units 6, and on a portion of a surface of the semiconductor layer 4 located between adjacent source electrode units 5 and exposed by the pixel defining units 6.

Figure 3:
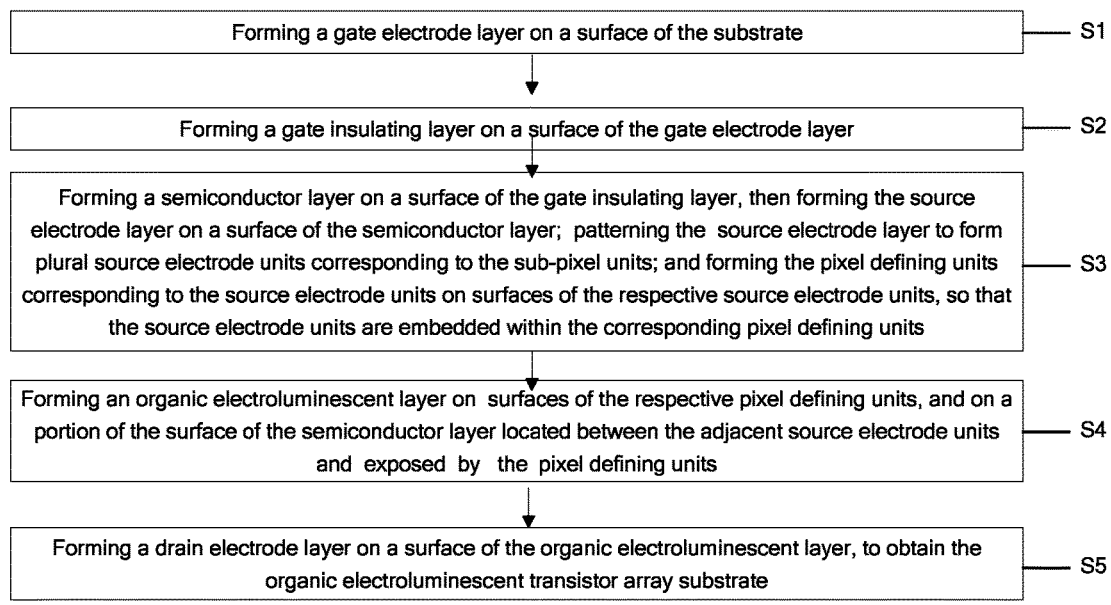
FIG. 3 is a flow chart of a fabrication method of an organic electroluminescent transistor array substrate provided by an embodiment of the present disclosure.

With reference to FIG. 3, the above-described fabrication method of the organic electroluminescent transistor array substrate specifically comprises steps of:

Step S1: forming the gate layer 2 on the surface of the substrate 1;

Step S2: depositing and forming the gate insulating layer 3 on a surface of the gate layer 2;

Step S3: forming the semiconductor layer 4 on a surface of the gate insulating layer 3, and then forming the source layer on a surface of the semiconductor layer 4; the source layer being formed to include plural source electrode units 5 corresponding to the sub-pixel units; Forming the pixel defining units 6 corresponding to the source electrode units 5 on surfaces of the respective source electrode units 5, so that the source electrode unit 5 is embedded within the corresponding pixel defining unit 6;

Step S4: forming the organic electroluminescent layer 7 on the surfaces of the respective pixel defining units 6, and on the portion of the surface of the semiconductor layer 4 located between the adjacent source electrode units 5 and exposed by the pixel defining units 6;

Step S5: forming the drain layer 8 on a surface of the organic electroluminescent layer 7, to obtain the organic electroluminescent transistor array substrate.

It should be noted that, in the above-described fabrication method of the organic electroluminescent transistor array substrate, the organic electroluminescent layer 7 can be formed not only by evaporating an organic light emitting material with a burying method or by using a solution printing method, but also by using other processes that can be implemented, which will not be limited to what is listed here.

In the organic electroluminescent transistor array substrate fabricated by using the above-described method, the respective source electrode units 5 are embedded within the pixel defining units 6 corresponding thereto. Thus, mutual influence of the surface electric fields generated by the adjacent source electrode units 5 can be avoided, ensureing uniform electric field at each sub-pixel unit, so as to eliminate a phenomenon that the carrier at the edge of the source electrode unit 5 is not under control of the gate layer 2.

The respective embodiments in the present description are illustrated, for example, in a progressive manner, same or similar parts between the respective embodiments can be mutually referred to, and what is emphatically illustrated by each embodiment can be difference from other embodiments. Because the method embodiments are substantially similar to the product embodiments, the method embodiments are described more simply, and part of description of the product embodiment can be referred to for relevant part thereof.

In the above-described step S3, the semiconductor layer 4 is formed to include via holes in one-to-one correspondence with the respective pixel defining units 6; the respective source electrode units 5 are formed on the semiconductor layer 4 and are located between adjacent via holes; when the pixel defining units 6 corresponding to the source electrode units 5 are formed on the surfaces of the respective source electrode units 5, the via holes are connected with the pixel defining units 6 in one-to-one correspondence; and the source electrode unit 5 is patterned to have a grid-shape pattern 9.

For example, a procedure of forming the gate layer 2 in the above-described step S1 is: forming gate lines 22 on the surface of the substrate 1, depositing a transparent conductive thin film on the surface of the exposed portion of the substrate 1 between the adjacent gate lines 22 and surfaces of the gate lines 22; patterning the transparent conductive thin film by photolithography to form plural transparent conductive thin film layers 21, so that the gate lines 22 and the transparent conductive thin film layers 21 constitute the gate layer 2, to complete fabrication of the gate layer 2.

In order to illustrate the above-described fabrication method of the organic electroluminescent transistor array substrate more clearly, hereinafter, further embodiments are provided:

Step S1: forming gate lines 22 on a surface of a glass substrate 1 by depositing and photolithography, by using a metal material with a good conductivity; depositing transparent conductive thin film on surfaces of the gate line 22 and the surface of the exposed portion of the substrate 1 between the adjacent gate lines 22; patterning the transparent conductive thin film by photolithography to form plural transparent conductive thin film layers 21, so that the gate lines 22 and the transparent conductive thin film layers 21 together constitute the gate layer 2; wherein, the metal material with a good conductivity is Al or Cu; and the transparent conductive thin film layers 21 are made of indium tin oxide (ITO) or indium zinc oxide (IZO).

Step S2: depositing the gate insulating layer 3 of a laminated structure on the surface of the gate layer 2 by using a plasma enhanced chemical vapor deposition method; the laminated structure being, for example, a multilayered $SiO_x$ layers, or alternately stacked $SiN_x$ layers and $SiO_x$ layers.

Step S3: depositing a semiconductor thin film on the surface of the gate insulating layer 3, forming plural via holes on a semiconductor layer thin film by photolithography, to obtain the semiconductor layer 4; depositing a source electrode thin film on the semiconductor layer 4, then performing photolithography to the source electrode thin film, forming plural grid-shaped source electrode units 5 corresponding to the sub-pixel units between the adjacent via holes, forming the pixel defining units 6 corresponding to the sub-pixel units on the surfaces of the respective grid-like source electrode units 5, and at the same time, ensuring that the source electrode units 5 are embedded within the corresponding pixel defining units 6; in addition, connecting the respective via holes with the respective pixel defining units 6 correspondingly one by one;

The semiconductor layer 4 is made of one or more materials of, for example, amorphous silicon, microcrystalline silicon, polycrystalline silicon, indium gallium zinc oxide (IGZO), indium tin zinc oxide (ITZO) and nitrogen zinc oxide (ZnON); and the respective pixel defining units 6 are made of an organic material or an inorganic material, for example, a plastic material or a SiOx material.

Step S4: forming the organic electroluminescent layer 7 on the surfaces of the respective pixel defining units 6 and on the surface of the portion of the semiconductor layer 4 located between the adjacent source electrode units 5 and exposed by the pixel defining units 6; for example, forming the organic electroluminescent layer 7 by evaporating an organic light emitting material with a burying method or by using a solution printing method.

Step S5: forming the drain layer 8 on the surface of the organic electroluminescent layer 7, to obtain the organic electroluminescent transistor array substrate; for example, evaporating Al, Mo, Mg, Ag, or alloy on the organic electroluminescent layer 7 to form the drain layer 8 by using a thermal evaporation method.

It should be noted that, with reference to FIG. 1, when the organic electroluminescent transistor array substrate is used together with a color filter substrate, the portion of a source electrode unit 5 of the organic electroluminescent transistor array substrate corresponds to the portion of black matrix 20 of the color filter substrate, the light emitting portion between adjacent source electrode units 5 corresponds to a pixel portion 10 of the color filter substrate; at this time, the drain layer 8 is made of a transparent material, which can enable emitted light to pass through the drain layer 8. When the organic electroluminescent transistor array substrate is not used together with the color filter substrate, there is no requirement for whether the material of the drain layer 8 is transmissive or not; in this case, light emitted from the organic electroluminescent layer 7 can be transmitted form the side where the gate layer 2 is located in the organic electroluminescent transistor array substrate.

In descriptions of the above-described implementation modes, respective features, structures, materials or characteristics may be combined in an applicable way in any one or more embodiments or examples.

The foregoing embodiments merely are specific implementation modes of the present disclosure, but a protection scope of the present disclosure is not limited thereto, changes or replacements easily conceived by any skilled in art within the technical scope disclosed by the present disclosure should be covered by the protection scope of the present disclosure. Therefore, the protection scope of the present disclosure is determined by a protection scope of claims.

The present application claims priority of Chinese Patent Application No. 201510432425.4 filed on Jul. 21, 2015, the disclosure of which is incorporated herein by reference in its entirety as part of the present application.

The invention claimed is:

1. An organic electroluminescent transistor array substrate, comprising a substrate, and a gate layer, a gate insulating layer, a semiconductor layer, a source layer, a pixel defining layer, an electroluminescent layer and a drain layer formed on the substrate, wherein, the source layer and the drain layer are located in different levels,
the source layer includes plural source electrode units corresponding to sub-pixel units respectively, the pixel defining layer includes plural pixel defining units corresponding to the source electrode units respectively, and the respective source electrode units are embedded within the pixel defining units corresponding thereto.

2. The organic electroluminescent transistor array substrate according to claim 1, wherein, the organic electroluminescent layer is formed on surfaces of the respective pixel defining units, and on a surface of an exposed portion of the semiconductor layer located between adjacent source electrode units and exposed by the pixel defining units.

3. The organic electroluminescent transistor array substrate according to claim 1, wherein, the semiconductor layer is provided with plural via holes therein, the respective source electrode units are provided on the semiconductor layer and are located between the adjacent via holes, and the respective pixel defining units extend into the respective via holes in one-to-one correspondence.

4. The organic electroluminescent transistor array substrate according to claim 3, wherein, the plural pixel defining units fill the plural via holes in one-to-one correspondence.

5. The organic electroluminescent transistor array substrate according to claim 1, wherein, the source electrode unit has a grid-shape pattern.

6. The organic electroluminescent transistor array substrate according to claim 1, wherein, the semiconductor layer is made of one or more materials of amorphous silicon, microcrystalline silicon, polycrystalline silicon, indium gallium zinc oxide, indium tin zinc oxide and nitrogen zinc oxide.

7. The organic electroluminescent transistor array substrate according to claim 1, wherein, the gate layer includes: plural gate lines and plural transparent conductive thin film layers, the gate lines are formed on a surface of the substrate, and the transparent conductive thin film layers are formed on an exposed portion of the surface of the substrate located between the adjacent gate lines and on surfaces of the gate lines.

8. The organic electroluminescent transistor array substrate according to claim 1, wherein, the gate layer, the gate insulating layer, the semiconductor layer, the source layer, the pixel defining layer, the organic electroluminescent layer and the drain layer are sequentially formed on the substrate.

9. A display device, comprising the organic electroluminescent transistor array substrate according to claim 1.

10. A fabrication method of the organic electroluminescent transistor array substrate according to claim 1, comprising:
forming a gate layer, a gate insulating layer, a semiconductor layer, a source layer, a pixel defining layer, an organic electroluminescent layer and a drain layer on a substrate, wherein, the source layer and the drain layer are located in different levels, the source layer includes plural source electrode units corresponding to sub-pixel units respectively, the pixel defining layer includes plural pixel defining units corresponding to the source electrode units respectively, and the respective source electrode units are embedded within the pixel defining units corresponding thereto.

11. The fabrication method of the organic electroluminescent transistor array substrate according to claim 10, wherein, forming the gate layer, the gate insulating layer, the semiconductor layer, the source layer, the pixel defining layer, the organic electroluminescent layer and the drain layer on the substrate includes:

forming the gate layer on a surface of the substrate;

forming the gate insulating layer on a surface of the gate layer;

forming the semiconductor layer on a surface of the gate insulating layer, and forming the source layer on a surface of the semiconductor layer; forming the pixel defining units corresponding to the source electrode units on surfaces of the respective source electrode units, so that the source electrode units are embedded within the corresponding pixel defining units;

forming the organic electroluminescent layer on surfaces of the respective pixel defining units, and a portion of the surface of the semiconductor layer located between the adjacent source electrode units and exposed by the pixel defining units;

forming the drain layer on a surface of the organic electroluminescent layer, to obtain the organic electroluminescent transistor array substrate.

12. The fabrication method of the organic electroluminescent transistor array substrate according to claim 11, wherein, the semiconductor layer is formed to include via holes in one-to-one correspondence with the respective pixel defining units; the respective source electrode units are formed on the semiconductor layer and are located between adjacent via holes; and the pixel defining units are formed to extend into the via holes correspondingly in one-to-one correspondence.

13. The fabrication method of the organic electroluminescent transistor array substrate according to claim 11, wherein, the source electrode unit has a grid-shape pattern.

14. The fabrication method of the organic electroluminescent transistor array substrate according to claim 11, wherein, forming the gate layer on the surface of the substrate is performed as: forming plural gate lines on the surface of the substrate, depositing a transparent conductive thin film on an exposed portion of the surface of the substrate between the adjacent gate lines and on surfaces of the gate lines, patterning the transparent conductive thin film by photolithography to form plural transparent conductive thin film layers, so that the gate lines and the transparent conductive thin film layers constitute the gate layer.

* * * * *